United States Patent
Tekumalla et al.

(10) Patent No.: US 8,904,255 B2
(45) Date of Patent: Dec. 2, 2014

(54) INTEGRATED CIRCUIT HAVING CLOCK GATING CIRCUITRY RESPONSIVE TO SCAN SHIFT CONTROL SIGNAL

(75) Inventors: Ramesh C. Tekumalla, Breinigsville, PA (US); Prakash Krishnamoorthy, Bethlehem, PA (US)

(73) Assignee: LSI Corporation, Milpitas, CA (US)

( * ) Notice: Subject to any disclaimer, the term of this patent is extended or adjusted under 35 U.S.C. 154(b) by 200 days.

(21) Appl. No.: 13/401,030

(22) Filed: Feb. 21, 2012

(65) Prior Publication Data

US 2013/0219238 A1   Aug. 22, 2013

(51) Int. Cl.
*G01R 31/28* (2006.01)

(52) U.S. Cl.
USPC ............ 714/729; 714/726; 702/117; 713/501

(58) Field of Classification Search
USPC .................. 714/726, 729; 713/501; 702/117
See application file for complete search history.

(56) References Cited

U.S. PATENT DOCUMENTS

| | | | | |
|---|---|---|---|---|
| 5,355,369 | A * | 10/1994 | Greenberger et al. | 714/727 |
| 2005/0222795 | A1* | 10/2005 | Rodgers et al. | 702/117 |
| 2006/0005103 | A1* | 1/2006 | Zhang et al. | 714/758 |
| 2006/0026473 | A1* | 2/2006 | Patrick Tan | 714/726 |
| 2007/0016834 | A1* | 1/2007 | Debnath et al. | 714/726 |
| 2009/0199036 | A1* | 8/2009 | Warnock et al. | 713/501 |
| 2009/0240997 | A1* | 9/2009 | Hasegawa | 714/731 |

OTHER PUBLICATIONS

S. Ghosh et al., "Tolerance to Small Delay Defects by Adaptive Clock Stretching," 13th IEEE International On-Line Testing Symposium (IOLTS), Jul. 2007, pp. 244-252.

Y. Hashizume et al., "A Novel Clock Deskew Method by Linear Programming," 50th Midwest Symposium on Circuits and Systems (MWSCAS), Aug. 2007, pp. 1261-1264.

N. Karimpour Darav et al., "A Low Overhead Fault Detection and Recovery Method for the Faults in Clock Generators," IEEE Circuits and Systems International Conference on Testing and Diagnosis (ICTD), Apr. 2009, pp. 1-4.

S. Wu et al., "Logic BIST Architecture Using Staggered Launch-on-Shift for Testing Designs Containing Asynchronous Clock Domains," IEEE 25th International Symposium on Defect and Fault Tolerance in VLSI Systems (DFT), Oct. 2010, pp. 358-366.

Z. Xin et al., "Variation-Tolerant and Low-Power Clock Network Design for 3D ICs," IEEE 61st Electronic Components and Technology Conference (ECTC), May-Jun. 2011, pp. 2007-2014.

U.S. Appl. No. 13/280,797 filed in the name of R.C. Tekumalla et al. on Oct. 25, 2011 and entitled "Dynamic Clock Domain Bypass for Scan Chains."

(Continued)

*Primary Examiner* — Sam Rizk
(74) *Attorney, Agent, or Firm* — Sheridan Ross P.C.

(57) ABSTRACT

An integrated circuit comprises scan test circuitry and additional circuitry subject to testing utilizing the scan test circuitry. The scan test circuitry comprises a scan chain having a plurality of scan cells. The integrated circuit further comprises a clock distribution network configured to provide clock signals to respective portions of the integrated circuit. The clock distribution network comprises clock gating circuitry configured to control delivery of one or more of the clock signals along respective clock signal lines of the clock distribution network at least in part responsive to a scan shift control signal that is also utilized to cause the scan cells to form a serial shift register during scan testing. The clock gating circuitry may be used to determine whether a clock delay defect that causes a scan error during scan testing will also cause a functional error during functional operation, thereby improving yield in integrated circuit manufacturing.

19 Claims, 7 Drawing Sheets

(56) References Cited

OTHER PUBLICATIONS

U.S. Appl. No. 13/348,357 filed in the name of Ramesh C. Tekumalla on Jan. 11, 2012 and entitled "Scan Chain Lockup Latch with Data Input Control Responsive to Scan Enable Signal."

U.S. Appl. No. 13/348,979 filed in the name of R.C. Tekumalla et al. on Jan. 12, 2012 and entitled "Scan Test Circuitry Configured for Bypassing Selected Segments of a Multi-Segment Scan Chain."

* cited by examiner

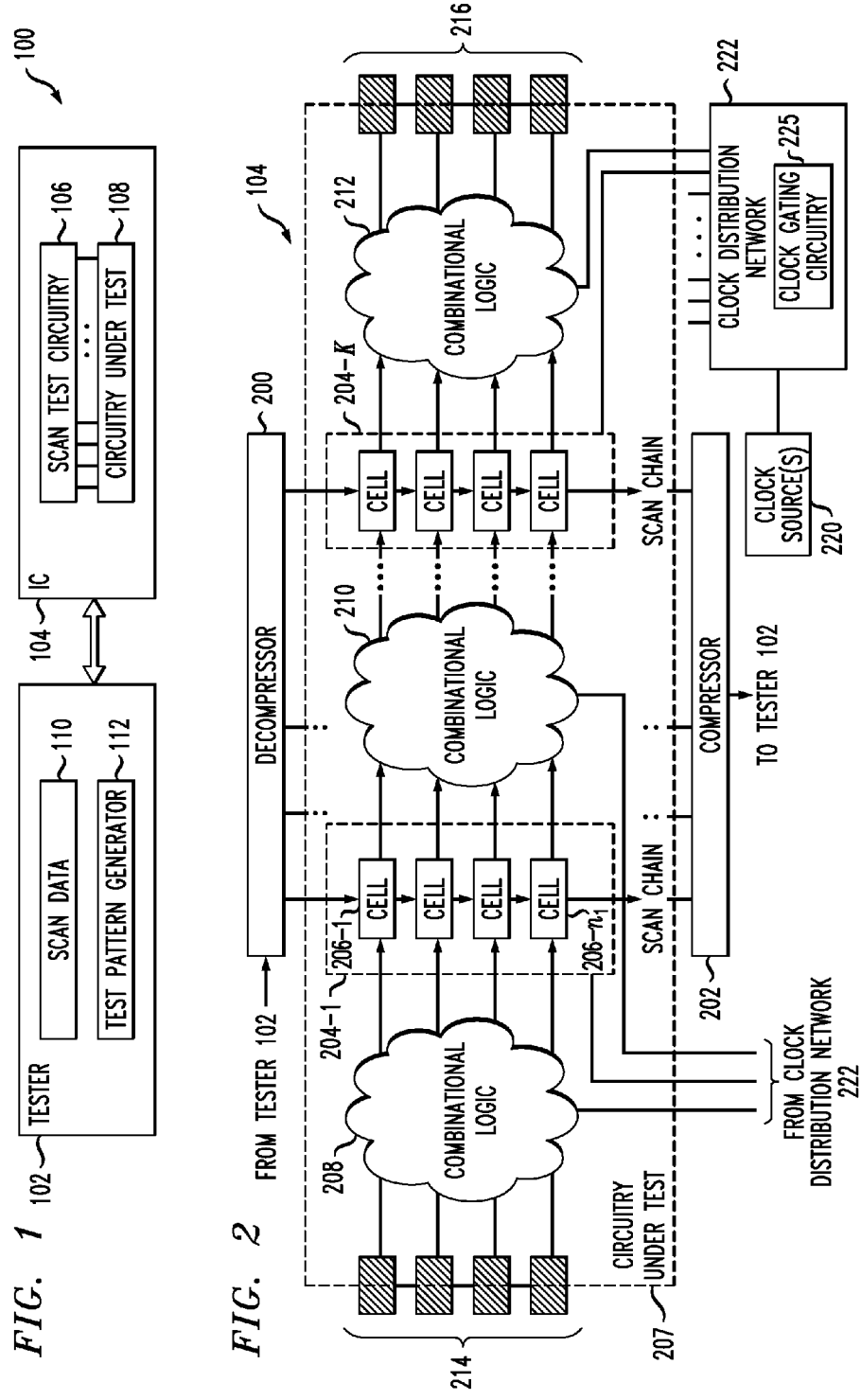

INTEGRATED CIRCUIT HAVING CLOCK GATING CIRCUITRY RESPONSIVE TO SCAN SHIFT CONTROL SIGNAL

BACKGROUND

Integrated circuits are often designed to incorporate scan test circuitry that facilitates testing for various internal fault conditions. Such scan test circuitry typically comprises scan chains comprising multiple scan cells. The scan cells may be implemented, by way of example, utilizing respective flip-flops. The scan cells of a given scan chain are configurable to form a serial shift register for applying test patterns at inputs to combinational logic of the integrated circuit. The scan cells of the given scan chain are also used to capture outputs from other combinational logic of the integrated circuit.

Scan testing of an integrated circuit may therefore be viewed as being performed in two repeating phases, namely, a scan shift phase in which the flip-flops of the scan chain are configured as a serial shift register for shifting in and shifting out of test patterns, and a scan capture phase in which the flip-flops of the scan chain capture combinational logic outputs. These two repeating scan test phases may be collectively referred to herein as a scan test mode of operation of the integrated circuit, or as simply a scan mode of operation.

Outside of the scan test mode and its scan shift and capture phases, the integrated circuit may be said to be in a functional mode of operation. Other definitions of the scan test and functional operating modes may also be used. For example, the capture phase associated with a given scan test may instead be considered part of a functional mode of operation, such that the modes include a scan shift mode having only the scan shift phase, and a functional mode that includes the capture phase.

Integrated circuits commonly include multiple clock domains. In an integrated circuit of this type, different portions of the integrated circuit are provided with different clock signals via a clock distribution network. For scan testing purposes, several clock signals having a common frequency but associated with different clock domains may be synchronized with one another. This is often done to facilitate scan testing. However, in some situations this type of simplification can be problematic, in that clock delay defects detected for synchronized clock signals during scan testing may nonetheless permit proper functional operation of the integrated circuit, because the functional operation may not require these clock signals to be synchronous. This can reduce device yield when manufacturing integrated circuits, as the devices failing the scan testing may be rejected for clock delay defects that do not actually interfere with functional operation.

SUMMARY

One or more illustrative embodiments of the invention provide clock gating circuitry for controlling application of clock signals to respective portions of an integrated circuit at least in part responsive to a scan shift control signal, so as to permit determination of whether or not clock delay defects detected in scan testing will also cause errors during functional operation of the integrated circuit.

In one embodiment, an integrated circuit comprises scan test circuitry and additional circuitry subject to testing utilizing the scan test circuitry. The scan test circuitry comprises at least one scan chain having a plurality of scan cells that are configurable to form a serial shift register during scan testing. The integrated circuit further comprises a clock distribution network configured to provide clock signals to respective portions of the integrated circuit. The clock distribution network comprises clock gating circuitry configured to control delivery of clock signals along respective clock signal lines of the clock distribution network at least in part responsive to a scan shift control signal that is also utilized to cause the scan cells of the scan chain to form the serial shift register during scan testing.

By way of example, the clock gating circuitry may comprise controllable clock gating latches serially inserted in respective ones of the clock signal lines. Associated with each of the clock gating latches is corresponding logic circuitry coupled to a first control input of the clock gating latch and operative to control a state of the clock gating latch at least in part responsive to the scan shift control signal. Each clock gating latch may further comprise a second control input operative to control a state of the clock gating latch at least in part responsive to a functional enable signal, wherein the functional enable signal is at a first designated logic level during scan testing and at a second designated logic level during functional operation outside of scan testing.

The logic circuitry may comprise a logic gate, such as a two-input OR gate, having a first input configured to receive the scan shift control signal and a second input configured to receive a test data signal associated with the corresponding clock gating latch. The test data signal may comprise a particular bit of a programmable test data register, in an embodiment in which the programmable test data register comprises a separate bit for each of the plurality of clock gating latches of the clock gating circuitry.

By utilizing the clock gating circuitry to determine whether a clock delay defect that causes a scan error during scan testing will also cause a functional error during functional operation, device yield in an integrated circuit manufacturing process can be significantly improved.

BRIEF DESCRIPTION OF THE DRAWINGS

FIG. 1 is a block diagram showing an integrated circuit testing system comprising a tester and an integrated circuit under test in an illustrative embodiment.

FIG. 2 shows a more detailed view of a portion of the integrated circuit in the testing system of FIG. 1.

DETAILED DESCRIPTION

Figure 3:
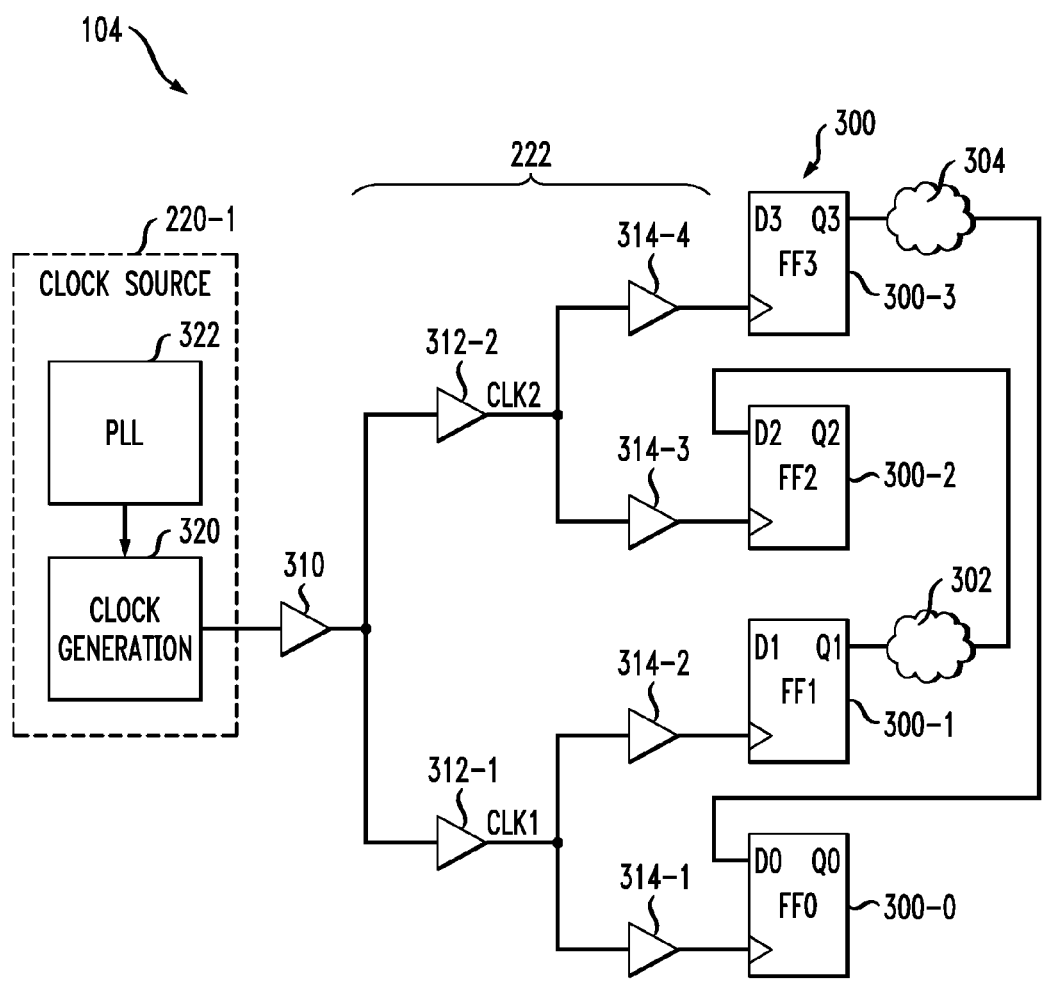
FIG. 3 illustrates one possible technique for distribution of clock signals to logic elements via a clock distribution network in the FIG. 2 integrated circuit without the use of clock gating circuitry.

Embodiments of the invention will be illustrated herein in conjunction with exemplary testing systems and corresponding integrated circuits comprising scan test circuitry for supporting scan testing of additional circuitry of those integrated circuits. It should be understood, however, that embodiments of the invention are more generally applicable to any testing system or associated integrated circuit in which it is desirable to determine if clock delay defects detecting during scan testing will interfere with proper functional operation of an integrated circuit, and/or to bypass such clock delay defects.

FIG. 1 shows an embodiment of the invention in which a testing system 100 comprises a tester 102 and an integrated circuit under test 104. The integrated circuit 104 comprises scan test circuitry 106 coupled to additional internal circuitry 108 that is subject to testing utilizing the scan test circuitry 106. The tester 102 stores scan data 110 associated with scan testing of the integrated circuit. Such scan data may correspond to test patterns provided by a test pattern generator 112. In other embodiments, at least a portion of the tester 102, such as the test pattern generator 112, may be incorporated into the integrated circuit 104. Alternatively, the entire tester 102 may be incorporated into the integrated circuit 104, as in a built-in self-test (BIST) arrangement.

The particular configuration of testing system 100 as shown in FIG. 1 is exemplary only, and the testing system 100 in other embodiments may include other elements in addition to or in place of those specifically shown, including one or more elements of a type commonly found in a conventional implementation of such a system. For example, various elements of the tester 102 or other parts of the system 100 may be implemented, by way of illustration only and without limitation, utilizing a microprocessor, central processing unit (CPU), digital signal processor (DSP), application-specific integrated circuit (ASIC), field-programmable gate array (FPGA), or other type of data processing device, as well as portions or combinations of these and other devices.

The integrated circuit 104 may be configured for installation on a circuit board or other mounting structure in a computer, server, mobile telephone or other type of communication device. Such communication devices may also be viewed as examples of what are more generally referred to herein as "processing devices." The latter term is also intended to encompass storage devices, as well as other types of devices comprising data processing circuitry.

Embodiments of the present invention may be configured to utilize compressed or noncompressed scan testing, and embodiments of the invention are not limited in this regard. However, the illustrative embodiment shown in FIG. 2 will be described primarily in the context of compressed scan testing.

Referring now to FIG. 2, portions of one potential configuration of the integrated circuit 104 are shown in greater detail. In this compressed scan testing arrangement, the scan test circuitry 106 comprises a decompressor 200, a compressor 202, and a plurality of scan chains 204-$k$, where k=1, 2, ... K.

Each of the scan chains 204 comprises a plurality of scan cells 206. A scan shift control signal is utilized to cause the scan cells 206 of at least a given one of the scan chains 204 to form a serial shift register during scan testing. The scan shift control signal may comprise, for example, a scan enable (SE) signal, such that the scan cells of the given scan chain form the serial shift register responsive to the SE signal being at a first designated logic level (e.g., a logic "1" level) and the scan cells capture functional data when the SE signal is at a second designated logic level (e.g., a logic "0" level). A single SE signal may be used to control all of the scan chains 204, or only a subset of those scan chains, with the remaining scan chains being controlled using one or more other SE signals. The SE signal in the present embodiment basically controls configuration of scan cells of a scan chain to form a serial shift register for shifting in and shifting out of test patterns. The SE signal may therefore be considered a type of scan shift enable signal, or more generally, a type of scan shift control signal.

When the scan chains 204 are configured to form respective serial shift registers for shifting in and shifting out scan test data associated with one or more test patterns to be applied by the tester 102, the scan test circuitry may be said to be in a scan shift phase of a scan test mode of operation. It should be appreciated, however, that a wide variety of other types of scan shift control signals and sets of integrated circuit operating modes and phases may be used in other embodiments. These embodiments therefore do not require the use of any particular definition of operating modes and phases.

The scan chains 204 may be associated with multiple distinct clock domains, or a single clock domain. It will be assumed in some embodiments that at least one of the scan chains 204 is a multiple clock domain scan chain, that is, a scan chain comprising sub-chains associated with respective distinct clock domains. Such sub-chains of a multiple clock domain scan chain may be separated from one another by lockup latches. Also, one or more of the sub-chains may be selectively bypassed using clock domain bypass circuitry so as to not be part of the serial shift register formed by the scan chain in the scan shift phase. For example, such clock domain bypass circuitry may be configured to bypass one or more of the sub-chains that are determined to be inactive for a particular test pattern, and the clock domain bypass circuitry may bypass different ones of the sub-chains for different test patterns. Additional details regarding clock domain bypass circuitry that may be utilized in embodiments of the invention may be found in U.S. patent application Ser. No. 13/280,797, filed Oct. 25, 2011 and entitled "Dynamic Clock Domain Bypass for Scan Chains," which is commonly assigned herewith and incorporated by reference herein.

The scan chains 204 are generally arranged in parallel with one another between respective outputs of the decompressor 200 and respective inputs of the compressor 202, such that in the scan shift mode of operation, scan test input data from the decompressor 200 is shifted into the scan chains 204 and scan test output data is shifted out of the scan chains 204 into the compressor 202.

The first scan chain 204-1 is of length $n_1$ and therefore comprises $n_1$ scan cells denoted 206-1 through 206-$n_1$. More generally, scan chain 204-$k$ is of length $n_k$ and therefore comprises a total of $n_k$ scan cells.

In some embodiments of the invention, the lengths of the scan chains 204 are balanced so that the same amount of time is needed to shift a desired set of scan test patterns into all of the scan chains. It may therefore be assumed without limitation that all of the scan chains 204 are of the same length n, such that $n_1=n_2=\ldots=n_k=n$.

Circuitry under test 207 in this embodiment comprises a plurality of combinational logic blocks, of which exemplary blocks 208, 210 and 212 are shown. The combinational logic blocks are illustratively arranged between primary inputs 214 and primary outputs 216 and separated from one another by the scan chains 204.

Combinational logic blocks such as 208, 210 and 212 may be viewed as examples of what are more generally referred to herein as "additional circuitry" that is subject to testing utilizing scan test circuitry in embodiments of the invention. By way of example, such internal circuitry blocks of integrated circuit 104 may represent portions of different integrated circuit cores, such as respective read channel and additional cores of a system-on-chip (SOC) integrated circuit in a hard disk drive (HDD) controller application, designed for reading and writing data from one or more magnetic storage disks of an HDD. In other embodiments, the circuit blocks subject to testing by the scan chains may comprise other types of functional logic circuitry, in any combination, and the term "additional circuitry" is intended to be broadly construed so as to cover any such arrangements of logic circuitry.

The decompressor 200 of the scan test circuitry 106 receives compressed scan data from the tester 102 and decompresses that scan data to generate scan test input data that is shifted into the scan chains 204 when such chains are configured as respective serial shift registers in the scan shift phase of the scan shift mode of operation. The compressor 202 of the scan test circuitry 106 receives scan test output data shifted out of the scan chains 204, also when such chains are configured as respective serial shift registers in the scan shift phase of the scan shift mode of operation, and compresses that scan test output data for delivery back to the tester 102.

Compressed scan input data is applied by tester 102 to M scan inputs of decompressor 200, and compressed scan output data is provided from compressor 202 back to tester 102 via M scan outputs. As noted previously, the K scan chains 204 are arranged in parallel between respective outputs of the decompressor 200 and respective inputs of the compressor 202 as shown. Each of the individual scan chains 204 is configurable to operate as a serial shift register in the scan shift phase of a scan test mode of operation of the integrated circuit 104 and also to capture functional data from combinational logic elements. The capture of functional data may be said to occur in a capture phase of the scan test mode. Again, other arrangements of operating modes and phases may be used in other embodiments.

The number K of scan chains 204 is generally much larger than the number M of decompressor inputs or compressor outputs. The ratio of K to M provides a measure of the degree of scan test pattern compression provided in the scan test circuitry 106. It should be noted, however, that the number of compressor outputs need not be the same as the number of decompressor inputs. For example, there may be M decompressor inputs and P compressor outputs, where M≠P but both M and P are much smaller than K.

The scan inputs of the decompressor 200 may be viewed as corresponding to respective ones of what are more generally referred to herein as "scan channels" of the integrated circuit 104.

Additional details regarding the operation of scan compression elements such as decompressor 200 and compressor 202 may be found in U.S. Pat. No. 7,831,876, entitled "Testing a Circuit with Compressed Scan Subsets," which is commonly assigned herewith and incorporated by reference herein. Again, scan compression elements such as decompressor 200 and compressor 202 may not be present in other embodiments of the invention. In an embodiment of the invention without scan compression, where the decompressor 200 and compressor 202 are eliminated, the scan channels may simply correspond to respective ones of the scan chains 204.

A given test pattern applied to the scan chains 204 in the present embodiment may be viewed as a scan vector, where a scan vector comprises a shift-in phase in which scan test input data is shifted into all of the scan chains 204, followed by a capture phase in which functional data is captured, followed by a shift-out phase in which scan test output data is shifted out from all of the scan chains 204. The scan vectors for different test patterns may overlap with one another, in that as input data is shifted in for a given test pattern, captured data for a previous pattern may be shifted out. The shift-in and shift-out phases may be individually or collectively referred to herein as one or more scan shift phases of the scan vector or associated test pattern. As noted above, such scan shift phases may be viewed as being part of a scan test mode of operation of the integrated circuit 104.

One or more embodiments of the invention are configured to incorporate clock gating circuitry for controlling application of clock signals to respective portions of an integrated circuit at least in part responsive to a scan shift control signal, such as the above-noted SE signal, so as to permit determination of whether or not clock delay defects detected in scan testing will also cause errors during functional operation of the integrated circuit, and/or to allow such clock delay defects to be bypassed.

In the FIG. 2 embodiment, the integrated circuitry 104 comprises one or more clock sources 220 coupled to a clock distribution network 222 that is configured to provide a plurality of clock signals to respective portions of the integrated circuit 104. For example, the clock distribution network in the present embodiment provides clock signals to the scan chains 204 and to the combinational logic blocks 208, 210 and 212. The clock distribution network 222 further comprises clock gating circuitry 225 that is configured to control delivery of clock signals along respective clock signal lines of the clock distribution network 222, at least in part responsive to a scan shift control signal that is also utilized to cause the scan cells of the scan chain to form a serial shift register during scan testing.

As mentioned previously, the scan shift control signal may comprise, for example, an SE signal, where the scan chains are configured as respective serial shift registers responsive to the SE signal being at a first designated logic level (e.g., a logic "1" level) and the scan cells of the scan chains are able to capture functional data when the SE signal is at a second designated logic level (e.g., a logic "0" level). Other types of scan shift control signals may be used in other embodiments.

The clock gating circuitry 225 in the present embodiment is configured to determine whether a clock delay defect that causes a scan error during scan testing will also cause a functional error during functional operation, and can therefore alleviate the problem of conventional practice wherein devices that fail scan testing are rejected for clock delay defects that do not actually interfere with functional operation. As a result, device yield in an integrated circuit manufacturing process can be significantly improved.

The clock gating circuitry 225 may also or alternatively be used to bypass clock delay defects that are detected on particular clock signal lines, as will be described.

FIG. 3 illustrates a portion of the integrated circuit 104 without the clock gating circuitry 225. In this view, clock source 220-1 provides a clock signal to clock distribution network 222 for distribution to clock inputs of respective flip-flops 300-0, 300-1, 300-2 and 300-3, also denoted as FF0, FF1, FF2 and FF3, respectively. The flip-flops 300 are assumed to be part of respective scan cells 206 of at least one of the scan chains 204.

The flip-flops 300 include data inputs D0, D1, D2 and D3, and outputs Q0, Q1, Q2 and Q3, respectively, and may include additional inputs and outputs, such as scan inputs, scan outputs, SE inputs, etc. There are connections between outputs of some of the flip-flops and data inputs of other ones of the flip-flops. For example, in this embodiment, the output Q1 of FF1 is coupled via combinational logic 302 to the data input D2 of FF2, and the output Q3 of FF3 is coupled via combinational logic 304 to the data input D0 of FF0. Clock inputs of the flip-flops 300 are driven by clock signal lines of the clock distribution network 322, which includes clock buffers 310, 312-1 and 312-2, and 314-1, 314-2, 314-3 and 314-4. More particularly, outputs of the clock buffers 314-1, 314-2, 314-3 and 314-4 drive the respective clock inputs of the flip-flops 300-0, 300-1, 300-2 and 300-3.

The clock source 220-1 comprises a clock generation module 320 coupled to a phase-locked loop (PLL) 322, and generates a clock signal that is applied to an input of an initial clock buffer 310. An output of the initial clock buffer 310 drives inputs of clock buffers 312-1 and 312-2. The outputs of the clock buffers 312-1 and 312-2 are denoted as clock signals CLK1 and CLK2, respectively. These are synchronous clocks both generated from the same clock signal provided by clock source 220-1. The flip-flops FF0 and FF1 are clocked by clock signals derived from CLK1 via buffers 314-1 and 314-2, and the flip-flops FF2 and FF3 are clocked by clock signals derived from CLK2 via buffers 314-3 and 314-4. However, all of the clocks applied to the flip-flops FF0 through FF3 in this embodiment are derived from the single clock signal provided by the common clock source 220-1.

The clock signals CLK1 and CLK2 in the present embodiment may be viewed as representing respective distinct clock domains of the integrated circuit 104. In other embodiments, clock gating latches may be inserted into multiple clock signal lines of a single clock domain.

In the FIG. 3 circuitry, the flip-flops FF1 and FF3 may be viewed as examples of what are referred to herein as "launch" flip-flops, in that they launch data into the respective logic blocks 302 and 304. The flip-flops FF0 and FF2 may be viewed as examples of what are referred to herein as "capture" flip-flops, because they capture the data launched from the respective launch flip-flops FF3 and FF1 after that launched data passes through the respective logic blocks 304 and 302.

Figure 4A:
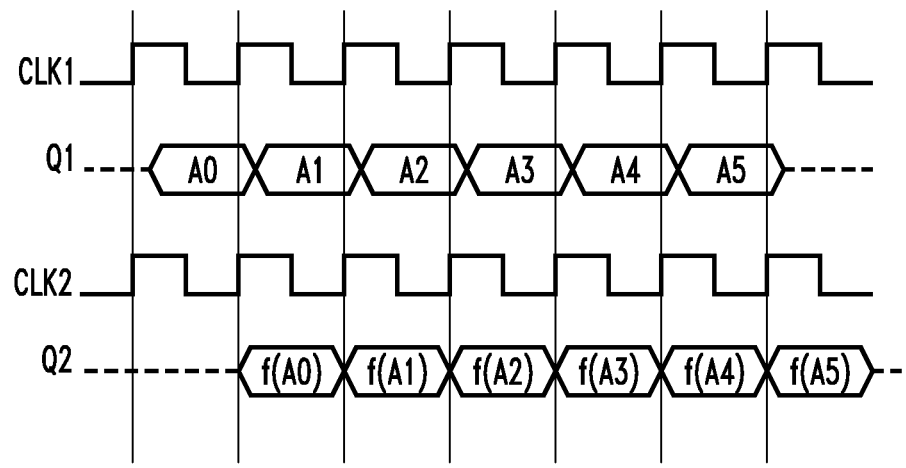
FIGS. 4A and 4B are timing diagrams illustrating the operation of the FIG. 3 circuitry.

FIG. 4A shows a timing diagram for the path from Q1 to Q2. The data is launched on Q1 at every positive edge of CLK1. The launched data passes through the logic block 302 and the resulting transformed data is captured at D2 using positive edges of CLK2. The data launched at Q1 is represented in the timing diagram by the series A0, A1, A2, A3, A4, A5, . . . , and the corresponding transformed data emerging out of the logic block 302 that is captured at D2 is shown as f(A0), f(A1), f(A2), f(A3), f(A4), f(A5), . . . , where f denotes the logic function of logic block 302 that transforms the launched data. As long as the clocks CLK1 and CLK2 remain synchronous, the data launched and captured using clocks CLK1 and CLK2 will have a well-defined relationship as illustrated in the FIG. 4A timing diagram.

Figure 4B:
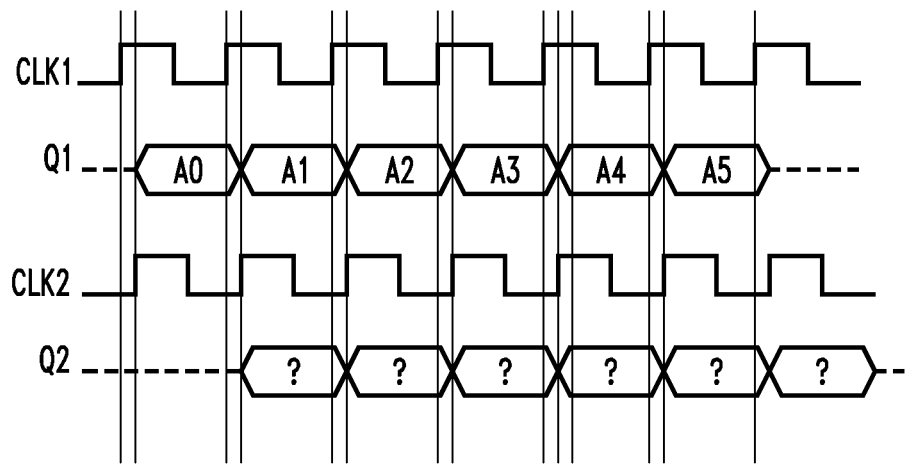

FIG. 4B shows a modified version of the timing diagram of FIG. 4A illustrating the impact of a clock delay defect on the path of CLK2. In this example, the clock delay defect causes the positive edges of CLK2 to be delayed in time relative to the corresponding positive edges of CLK1. As a result, there is an indeterminate data state at D2 when FF2 is clocked by the positive edges of CLK2, leading to errors in the form of unknown data at the Q2 output. These errors may be attributable to setup or hold time violations.

A clock delay defect on a single clock path as illustrated in FIG. 4B can have a significant negative impact on scan test pattern coverage. In the FIG. 4B example, the Q2 output may be the source of data for one or more other flip-flops, and thus an entire test pattern may be corrupted.

Figure 5:
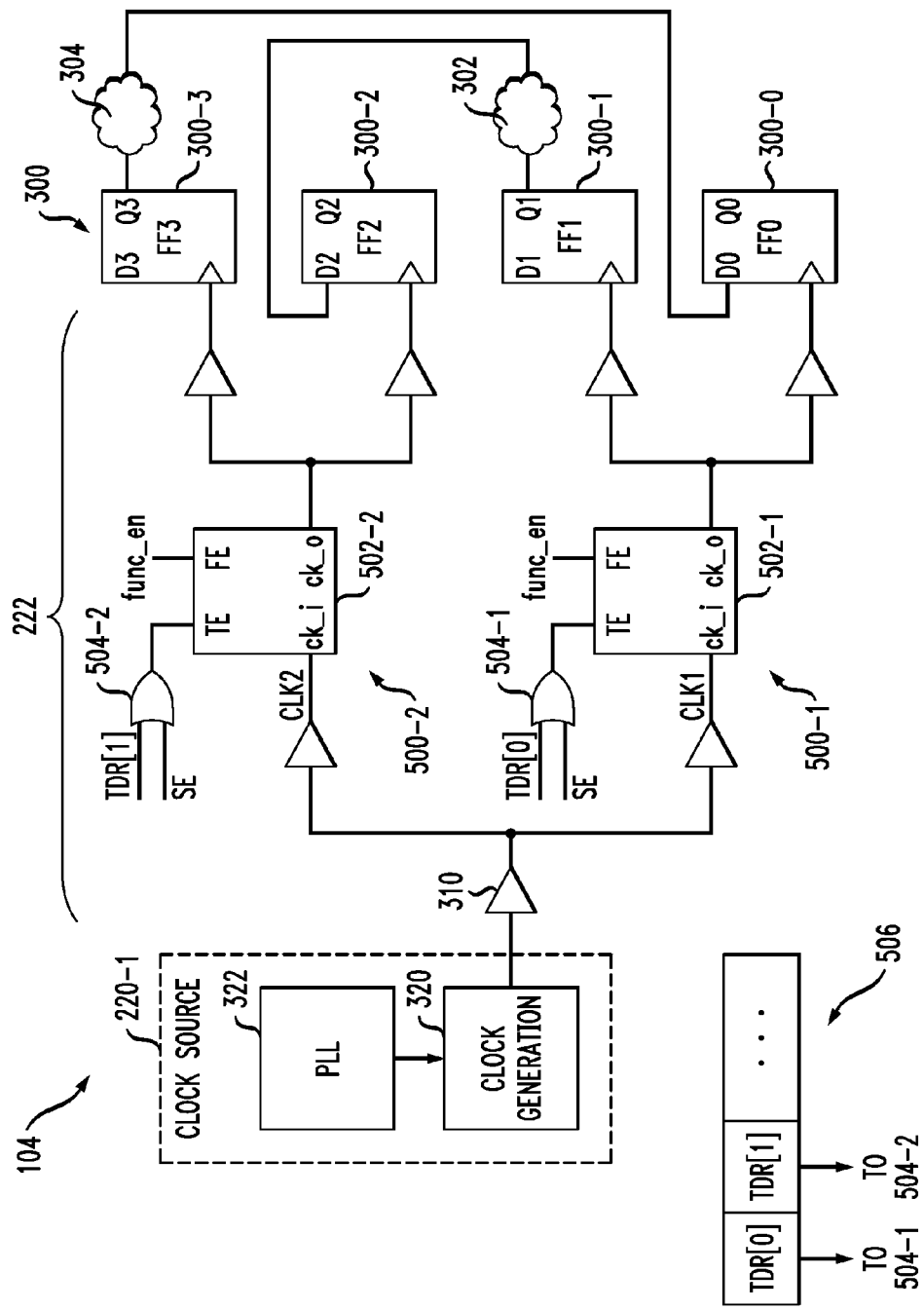
FIG. 5 shows the FIG. 3 circuitry as adapted to incorporate clock gating circuitry within clock signal paths of the clock distribution network.

This issue is addressed in the present embodiment by incorporating clock gating circuitry 225 into the clock distribution network 222, as illustrated in greater detail in FIG. 5. The clock gating circuitry 225 in this embodiment is generally configured to control delivery of the clock signals CLK1 and CLK2 along their respective clock signal lines of the clock distribution network 222, utilizing controllable clock gating latches serially inserted in each line in a manner that permits determination of whether a particular clock delay defect on one of the clock signal lines that causes a scan error during scan testing will also cause a functional error during functional operation. Additionally or alternatively, the clock gating circuitry 225 may be used to bypass clock delay defects associated with particular clock signal lines.

In the FIG. 5 circuitry, the clock gating circuitry 225 more particularly comprises first gating circuitry 500-1 and second gating circuitry 500-2, for gating the respective clock signals CLK1 and CLK2.

The first gating circuitry 500-1 comprises a clock gating latch 502-1 coupled in series with the CLK1 clock signal line of the clock distribution network 222, and logic circuitry 504-1 coupled to a first control input of the clock gating latch 502-1 and operative to control a state of the clock gating latch at least in part responsive to a scan shift control signal, which in this embodiment is more particularly assumed to be the above-described SE signal. The first control input is illustratively a test enable (TE) input which is configured to receive the output of the logic circuitry 504-1.

Similarly, the second gating circuitry 500-2 comprises a clock gating latch 502-2 coupled in series with the CLK2 clock signal line of the clock distribution network 222, and logic circuitry 504-2 having an output coupled to the TE control input of the clock gating latch 502-2. The logic circuitry 504-2 is operative to control a state of the clock gating latch at least in part responsive to the SE signal.

Each of the clock gating latches 502-1 and 502-2 further comprises a second control input, illustratively a functional enable (FE) input, operative to control a state of the clock gating latch at least in part responsive to a functional enable signal func_en, wherein the functional enable signal is at a first designated logic level (e.g., a logic "0" level) during scan testing and at a second designated logic level (e.g., a logic "1" level) outside of scan testing during functional operation of the integrated circuit.

The functional enable signal func_en may be generated, by way of example, as the complement of a scan mode (SM) signal, where the SM signal is always at a logic "1" level during scan testing and otherwise at a logic "0" level. The SM signal may be internally generated within the integrated circuit 104, but could alternatively be supplied from a chip-level primary input.

The logic circuitry 504-1 and 504-2 in the present embodiment comprises respective logic gates, and more particularly respective two-input OR gates, each having a first input configured to receive the SE signal and a second input configured to receive a test data signal TDR[0] or TDR[1]. Other types of logic gates or arrangements of logic circuitry may be used in other embodiments.

Although only two sets of gating circuitry 500-1 and 500-2 are shown in the FIG. 5 embodiment, other embodiments can have any number of such sets of gating circuitry, arranged on respective clock signal lines of the clock distribution network 222. The clock distribution network in the present embodiment comprises a clock tree or any other configuration of circuitry configured to deliver or otherwise distribute clock signals to respective portions of an integrated circuit.

The test data signals TDR[i], where i=0, 1, . . . , comprise respective bits of a programmable test data register 506. The test data register 506 may be considered part of the clock gating circuitry 225, or may be implemented in another portion of the integrated circuit 104. The test data register may be programmed by tester 102, which illustratively comprises automated test equipment (ATE). In this embodiment, the programmable test data register comprises a separate bit for each of the clock gating latches 502 of the clock gating circuitry 225, although other types of register configurations and test signals may be used. For example, in other embodiments the test data signals TDR[i] may comprise respective chip-level primary input signals of the integrated circuit 104.

Each of the clock gating latches 502-1 and 502-2 has a clock input ck_i and a clock output ck_o, and is controllable between an active state in which a clock signal applied to its clock signal input passes to its output and a freeze state in which the clock signal applied to its clock signal input does not pass to its clock output but the clock output is instead maintained at a designated logic level (e.g., a logic "0" level). A given one of the clock gating latches 502 is placed in its active state, where its clock input is connected to its clock output, responsive to the func_en signal being at a logic "1" level or at least one of the SE signal and the TDR[i] signal being at the logic "1" level, and is otherwise in its freeze state. Therefore, the clock gating latches 502-1 and 502-2 inserted in the respective CLK1 and CLK2 clock paths allow two possible states for the clocks feeding the flip-flops 300.

As noted above, the func_en signal applied to the FE inputs of the clock gating latches 502-1 and 502-1 is at a logic "1" level in functional mode and at a logic "0" level during scan test mode. Accordingly, when func_en is at the logic "1" level, the FE input overrides the TE input and the clock gating latches are in their active states, thereby making the clocks CLK1 and CLK2 free running. In the scan test mode, when func_en is at the logic "0" level, the TE inputs of the latches control their respective states. Therefore, the clock CLK1 or CLK2 is free-running when SE is at a logic "1" level or the corresponding test data signal TDR[i] is at a logic "1" level or both.

In the absence of detected clock delay defects, both TDR[0] and TDR[1] are set to logic "1" levels such that the clocks CLK1 and CLK2 remain free running in the scan test mode. The presence of a clock delay defect on CLK1 or CLK2 will typically manifest itself in the form of one or more failures on tester 102 in test patterns that are shifted out from the scan chains 204. Such test pattern failures may be viewed as examples of what are more generally referred to herein as "scan errors."

Scan errors typically do not indicate which clock signal is experiencing a delay defect. Accordingly, a determination of which clock signal, if any, is experiencing a delay defect can be made using a two-step process in which each of CLK1 and CLK2 is checked while the other clock is frozen. This process will be described in greater detail below with reference to the timing diagrams of FIGS. 6A and 6B, which correspond to freezing of CLK1 and CLK2, respectively.

Figure 6A:
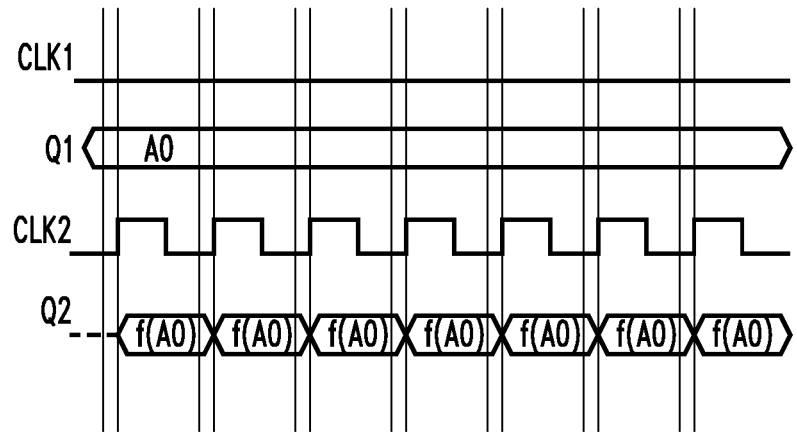
FIGS. 6A, 6B and 6C are timing diagrams illustrating the operation of the FIG. 5 circuitry.

In the first step of the process, a determination is made as to whether or not CLK1 has a delay defect. Such a delay defect will generally be manifested by failures in portions of test patterns associated with the CLK2 domain. Accordingly, if such failures are observed during scan testing, TDR[0] is set to a logic "0" level for subsequent capture phases of the scan test mode. This will freeze CLK1 during captures and therefore freeze the state of the flip-flops FF0 and FF1 to deterministic values. The timing diagram of FIG. 6A shows the resulting stable Q1 output, denoted by A0. The Q2 output of FF2 is also stable at f(A0) since Q1 is now held constant. The test patterns are then regenerated taking this configuration into account, and reapplied to the scan chains. If these regenerated test patterns do not fail on the tester, it has been confirmed that CLK1 has a delay defect.

Figure 6B:
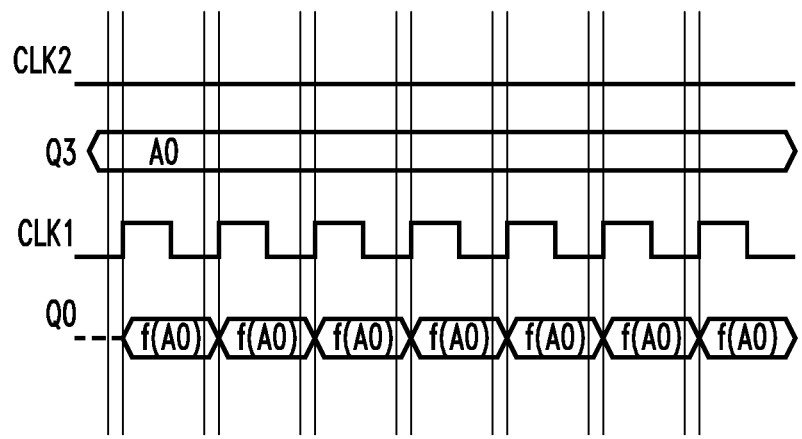

In the second step of the process, a determination is made as to whether or not CLK2 has a delay defect. Such a delay defect will generally be manifested by failures in portions of test patterns associated with the CLK1 domain. Accordingly, if such failures are observed during scan testing, TDR[1] is set to a logic "0" level for subsequent capture phases of the scan test mode. This will freeze CLK2 during captures and therefore freeze the state of the flip-flops FF2 and FF3 to deterministic values. The timing diagram of FIG. 6B shows the resulting stable Q3 output, denoted by A0. The Q0 output of FF0 is also stable at f(A0) since Q3 is now held constant. The test patterns are then regenerated taking this configuration into account, and reapplied to the scan chains. If these regenerated test patterns do not fail on the tester, it has been confirmed that CLK2 has a delay defect.

If either CLK1 or CLK2 is determined to have a delay defect using the process described above, the corresponding test signal TDR[i] will remain set to a logic "0" level for subsequent capture phases of the scan test mode. This will ensure that scan test results are not adversely impacted by the clock delay defect, and will help avoid devices being rejected for clock delay defects that do not adversely impact functional operation. Thus, appropriate programming of the TDR bits can be used to bypass one or more clock delay defects that are detected in the manner described above.

Figure 6C:
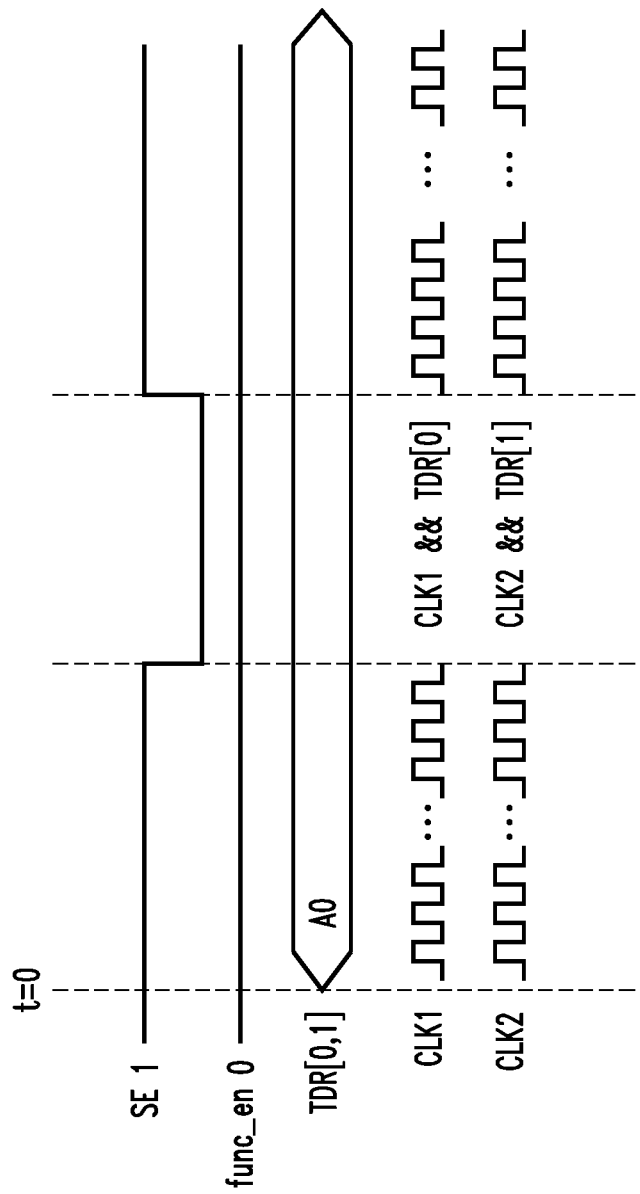

The timing diagram of FIG. 6C illustrates the states of the SE, func_en and TDR signals relative to CLK1 and CLK2 during scan testing which is assumed in this example to begin at time t=0. The func_en signal is maintained at a logic "0" level throughout the scan test mode, which may encompass multiple scan shift and capture phases. As mentioned previously, the func_en signal may be generated as the complement of an SM signal, where the SM signal is always at a logic "1" level during scan testing and otherwise at a logic "0" level. The TDR bits will be set to particular user-defined combinations throughout the scan test in the manner described previously. During a given capture phase of the scan testing, the SE signal is at a logic "0" level and the clock output of a given one of the clock gating latches is therefore dependent on the value of the corresponding TDR bit. More particularly, the input clock and the corresponding TDR bit in the present embodiment are characterized as being subject to an AND operation (&&) to produce the clock at the output of the latch while the SE signal is at the logic "0" level, as is illustrated for both CLK1 and CLK2 in the FIG. 6C timing diagram.

It is to be appreciated that the particular circuitry and timing arrangements shown in FIGS. 5 and 6 are presented by way of illustrative example only, and numerous alternative arrangements of clock gating latches and other clock gating circuitry may be used to implement the described clock gating functionality. This functionality can be implemented in one or more of the illustrative embodiments without any significant negative impact on integrated circuit area requirements or functional timing requirements.

As noted above, other embodiments may include more clock gating latches inserted on respective clock signal lines. A larger number of clock gating latches allows a wider variety of clock delay defects to be detected and then bypassed or otherwise addressed, but at the cost of increased area overhead and power consumption. For example, insertion of clock gating latches at every leaf node of a clock tree will provide the infrastructure to bypass all clock delay defects. However, the overhead for this approach will be significant. On the other hand, inserting clock gating latches at the clock roots alone would require very few clock gating latches, equal to the number of clock roots present in the clock tree. Accordingly, an appropriate choice in many applications will be to insert the clock gating latches on only those clock signal lines that feed respective portions of a scan chain in the design, a level or two in the tree below the clock root, as in the illustrative embodiment of FIG. 5. This will allow sufficient granularity to bypass delay defects in the clock paths while not requiring an excessive number of clock gating latches and associated logic gates and test registers.

As a more particular example, consider a given integrated circuit design for an HDD SOC that includes a read channel and its disk associated controller. The SOC also includes a single clock source, comprising a clock generator and a PLL as in the FIG. 5 embodiment, that generates all the clock signals for the design. The design was synthesized using a design compiler and mapped to a 40 nanometer (nm) technology library. Timing analysis was performed on the design and the clocks were synthesized and balanced. The design was also placed and routed and the resulting database was then processed to determine appropriate locations for insertion of clock gating latches in order to bypass potential clock delay defects. The design included a total of 22 scan chains, 14 of which are about 10,000 flip-flops long and the other 8 of which are about 2,000 flip-flops long, on average. Moreover, scan segments of about 1,000 flip-flops within a given scan chain are clocked by the same synchronous clock. This means that all these 1,000 flip-flops will have the same the same clock root.

There are typically three to four stages of clock tree buffers from the clock root to the leaf nodes that feed the flip-flops in a given design, and in the present example design a clock gating latch was inserted in each clock signal line one level below the root. For example, for a scan segment that is 1,000 flip-flops long, a clock gating latch is inserted for the first 500 flip-flops and another clock gating latch for the remaining 500 flip-flops. So, for a scan chain that is 10,000 flip-flops long, 20 clock gating latches are inserted. For the shorter scan chains that are 2,000 flip-flops long, 4 clock gating latches are inserted for each scan chain.

Therefore, in this design, a total of 14×20=280 clock gating latches were inserted for the long scan chains and a total of 8×4=32 clock gating latches were inserted for the shorter chains. A total of 312 TDR registers were allocated to control these latches. These registers were configured to be programmable by the ATE of tester 102 through a Joint Test Action Group (JTAG) interface. Patterns were then generated based on this design architecture to detect scenarios where clock delay defects occur. If actual delay defects occur in the manufactured integrated circuit, the appropriate TDR bits will be set and test patterns will be regenerated in the manner previously described, such that the impact on yield will be reduced.

As mentioned previously, the presence of clock gating latches of the type described above in conjunction with FIG. 5 within integrated circuit 104 may be made apparent to a test generation tool so that the tool can take the associated functionality into account in generating test patterns. In order to accomplish this, one or more input files describing the operation of this circuitry may be provided to the test generation tool.

Figure 7:
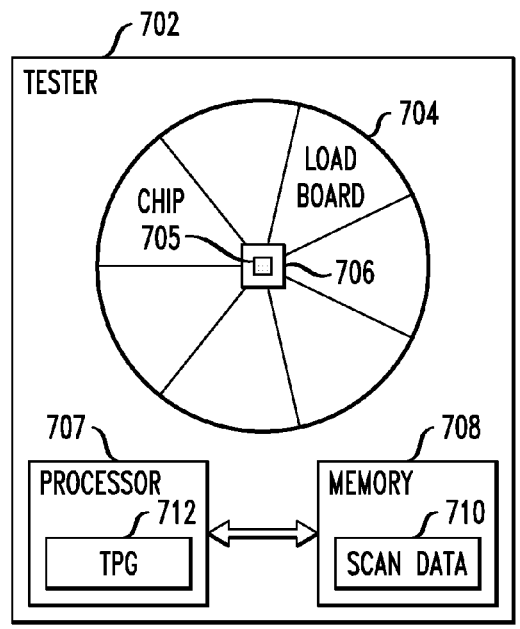
FIG. 7 shows one possible implementation of the testing system of FIG. 1.

The tester 102 in the testing system 100 of FIG. 1 need not take any particular form, and various conventional testing system arrangements can be modified in a straightforward manner to support the clock gating functionality disclosed herein. One possible example is shown in FIG. 7, in which a tester 702 comprises a load board 704 in which an integrated circuit 705 to be subject to scan testing using the techniques disclosed herein is installed in a central portion 706 of the load board 704. The tester 702 also comprises processor and memory elements 707 and 708 for executing stored program code. In the present embodiment, processor 707 is shown as implementing a test pattern generator 712. Associated scan data 710 is stored in memory 708. Numerous alternative testers may be used to perform scan testing of an integrated circuit as disclosed herein. Also, as indicated previously, in alternative embodiments at least portions of the tester 702 may be incorporated into the integrated circuit itself, as in BIST arrangement.

Figure 8:
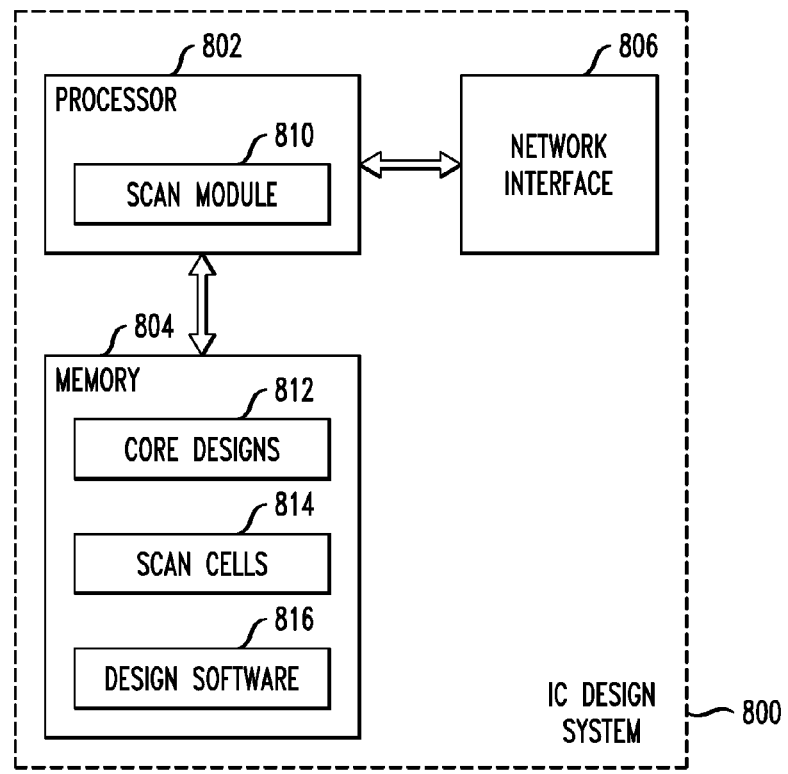
FIG. 8 is a block diagram of a processing system for generating an integrated circuit design comprising clock gating circuitry of the type illustrated in FIG. 5.

The insertion of scan chains 204 and associated clock gating circuitry 225 of a given integrated circuit design may be performed in a processing system 800 of the type shown in FIG. 8. Such a processing system in this embodiment more particularly comprises a design system configured for use in designing integrated circuits such as integrated circuit 104 to include scan chains 204 and associated clock gating circuitry 225.

The system 800 comprises a processor 802 coupled to a memory 804. Also coupled to the processor 802 is a network interface 806 for permitting the processing system to communicate with other systems and devices over one or more networks. The network interface 806 may therefore comprise one or more transceivers. The processor 802 implements a scan module 810 for supplementing core designs 812 with scan cells 814 and associated clock gating circuitry in the manner disclosed herein, in conjunction with utilization of integrated circuit design software 816.

By way of example, the scan chain circuitry 106 comprising scan chains 204 and associated clock gating circuitry 225 may be generated in system 800 using an RTL description and then synthesized to gate level using a specified technology library. A test generation model may then be created for generating test patterns using a test generation tool. Control files or other types of input files may be used to provide the test generation tool with information such as the particular scan chain portions that are driven by clock signals of particular clock domains in a given embodiment. Once the corresponding rules are in place, a rule checker may be run so that the test generation tool has visibility of the scan chains taking into account the operation of the clock gating circuitry. Test patterns may then be generated for the scan chain circuitry.

Elements such as 810, 812, 814 and 816 are implemented at least in part in the form of software stored in memory 804 and processed by processor 802. For example, the memory 804 may store program code that is executed by the processor 802 to implement particular scan chain and clock gating functionality of module 810 within an overall integrated circuit design process. The memory 804 is an example of what is more generally referred to herein as a computer-readable medium or other type of computer program product having computer program code embodied therein, and may comprise, for example, electronic memory such as RAM or ROM, magnetic memory, optical memory, or other types of storage devices in any combination. The processor 802 may comprise a microprocessor, CPU, ASIC, FPGA or other type of processing device, as well as portions or combinations of such devices. The memory 708 of FIG. 7 may be viewed as another illustrative example of a computer program product as the latter term is used herein.

As indicated above, embodiments of the invention may be implemented in the form of integrated circuits. In a given such integrated circuit implementation, identical die are typically formed in a repeated pattern on a surface of a semiconductor wafer. Each die includes scan test circuitry and associated clock gating circuitry as described herein, and may include other structures or circuits. The individual die are cut or diced from the wafer, then packaged as an integrated circuit. One skilled in the art would know how to dice wafers and package die to produce integrated circuits. Integrated circuits so manufactured are considered embodiments of this invention.

Again, it should be emphasized that the embodiments of the invention as described herein are intended to be illustrative only. For example, other embodiments of the invention can be implemented using a wide variety of other types of scan test circuitry, with different types and arrangements of scan cells, as well as different types and arrangements of clock distribution networks, clock gating circuitry and control signaling, than those included in the embodiments described herein. These and numerous other alternative embodiments within the scope of the following claims will be readily apparent to those skilled in the art.

What is claimed is:

1. An integrated circuit comprising:
    scan test circuitry comprising at least one scan chain having a plurality of scan cells;
    additional circuitry subject to testing utilizing the scan test circuitry; and
    a clock distribution network configured to provide a plurality of clock signals to respective portions of the integrated circuit;
    the clock distribution network comprising:
    clock gating circuitry configured to control delivery of one or more of the clock signals along respective clock signal lines of the clock distribution network at least in part responsive to a scan shift control signal and a functional enable signal;
    wherein the scan shift control signal is also utilized to cause the scan cells of the scan chain to form a serial shift register during scan testing; and
    wherein the clock gating circuitry is configured to control delivery of the clock signals along the respective clock signal lines of the clock distribution network utilizing controllable clock gating latches serially inserted in each line in a manner that permits determination of whether a particular clock delay defect on one of the clock signal lines that causes a scan error during scan testing will also cause a functional error during functional operation.

2. The integrated circuit of claim 1 wherein the scan cells of the scan chain form the serial shift register responsive to the scan shift control signal being at a first designated logic level and the scan cells capture functional data when the scan shift control signal is at a second designated logic level.

3. The integrated circuit of claim 1 wherein the clock gating circuitry further comprises for each of at least a subset of the clock signal lines of the clock distribution network:
    a clock gating latch coupled in series with the clock signal line of the clock distribution network; and
    logic circuitry having an output coupled to a first control input of the clock gating latch and being operative to control a state of the clock gating latch at least in part responsive to the scan shift control signal.

4. A processing device comprising the integrated circuit of claim 1.

5. The integrated circuit of claim 1 wherein the clock gating circuitry further comprises:
    a clock gating latch having first and second control inputs; and
    logic circuitry having an output coupled to the first control input of the clock gating latch, and an input configured to receive the scan shift control signal; and
    wherein the second control input of the clock gating latch is configured to receive the functional enable signal.

6. The integrated circuit of claim 5 wherein the logic circuitry has an additional input configured to receive a test data signal.

7. An integrated circuit comprising:
    scan test circuitry comprising at least one scan chain having a plurality of scan cells;
    additional circuitry subject to testing utilizing the scan test circuitry; and
    a clock distribution network configured to provide a plurality of clock signals to respective portions of the integrated circuit;
    the clock distribution network comprising:
    clock gating circuitry configured to control delivery of one or more of the clock signals along respective clock signal lines of the clock distribution network at least in part responsive to a scan shift control signal and a functional enable signal;
    wherein the scan shift control signal is also utilized to cause the scan cells of the scan chain to form a serial shift register during scan testing;
    wherein the clock gating circuitry comprises for each of at least a subset of the clock signal lines of the clock distribution network:
    a clock gating latch coupled in series with the clock signal line of the clock distribution network; and
    logic circuitry having an output coupled to a first control input of the clock gating latch and being operative to control a state of the clock gating latch at least in part responsive to the scan shift control signal; and
    wherein the clock gating latch further comprises a second control input operative to control a state of the clock gating latch at least in part responsive to the functional enable signal, wherein the functional enable signal is at a first designated logic level during scan testing and at a second designated logic level outside of scan testing.

8. An integrated circuit comprising:
    scan test circuitry comprising at least one scan chain having a plurality of scan cells;
    additional circuitry subject to testing utilizing the scan test circuitry; and
    a clock distribution network configured to provide a plurality of clock signals to respective portions of the integrated circuit;
    the clock distribution network comprising:
    clock gating circuitry configured to control delivery of one or more of the clock signals along respective clock signal lines of the clock distribution network at least in part responsive to a scan shift control signal and a functional enable signal;
    wherein the scan shift control signal is also utilized to cause the scan cells of the scan chain to form a serial shift register during scan testing;
    wherein the clock gating circuitry comprises for each of at least a subset of the clock signal lines of the clock distribution network:
    a clock gating latch coupled in series with the clock signal line of the clock distribution network; and
    logic circuitry having an output coupled to a first control input of the clock gating latch and being operative to control a state of the clock gating latch at least in part responsive to the scan shift control signal; and
    wherein the logic circuitry comprises a logic gate having a first input configured to receive the scan shift control signal and a second input configured to receive a test data signal.

9. The integrated circuit of claim 8 wherein the test data signal comprises a particular bit of a programmable test data register.

10. The integrated circuit of claim 9 wherein the programmable test data register comprises a separate bit for each of a plurality of clock gating latches of the clock gating circuitry.

11. The integrated circuit of claim 8 wherein the test data signal comprises a chip-level primary input signal.

12. The integrated circuit of claim 8 wherein the logic circuitry comprises a two-input OR gate.

13. An integrated circuit comprising:
scan test circuitry comprising at least one scan chain having a plurality of scan cells;
additional circuitry subject to testing utilizing the scan test circuitry; and
a clock distribution network configured to provide a plurality of clock signals to respective portions of the integrated circuit;
the clock distribution network comprising:
clock gating circuitry configured to control delivery of one or more of the clock signals along respective clock signal lines of the clock distribution network at least in part responsive to a scan shift control signal and a functional enable signal;
wherein the scan shift control signal is also utilized to cause the scan cells of the scan chain to form a serial shift register during scan testing;
wherein the clock gating circuitry comprises for each of at least a subset of the clock signal lines of the clock distribution network:
a clock gating latch coupled in series with the clock signal line of the clock distribution network; and
logic circuitry having an output coupled to a first control input of the clock gating latch and being operative to control a state of the clock gating latch at least in part responsive to the scan shift control signal;
wherein the clock gating latch comprises a clock signal input and an output;
wherein the clock gating latch is controllable between an active state in which a clock signal applied to its clock signal input passes to its output and a freeze state in which the clock signal applied to its clock signal input does not pass to its output but the output is instead maintained at a designated logic level; and
wherein the clock gating latch is placed in its active state responsive to the functional enable signal being at a designated logic level or responsive to one of the scan shift control signal and a test data signal being at the designated logic level, and is otherwise in its freeze state.

14. A method comprising:
utilizing a scan shift control signal to cause scan cells of a scan chain in an integrated circuit to form a serial shift register during scan testing; and
controlling delivery of clock signals along respective clock signal lines of a clock distribution network of the integrated circuit at least in part responsive to the scan shift control signal and a functional enable signal;
wherein the controlling step comprises controlling delivery of the clock signals along the respective clock signal lines of the clock distribution network utilizing controllable clock gating latches serially inserted in each line in a manner that permits determination of whether a particular clock delay defect on one of the clock signal lines that causes a scan error during scan testing will also cause a functional error during functional operation.

15. A non-transitory computer-readable storage medium having computer program code embodied therein for use in scan testing an integrated circuit, wherein the computer program code when executed in a testing system causes the testing system to perform the steps of the method of claim 14.

16. An apparatus comprising:
clock gating circuitry comprising a plurality of clock gating latches configured for serial insertion into respective clock signal lines of a clock distribution network of an integrated circuit;
wherein the clock gating latches are configured to control delivery of clock signals along respective ones of the clock signal lines at least in part responsive to a scan shift control signal and a functional enable signal;
wherein the scan shift control signal is also utilized to cause scan cells of a scan chain of the integrated circuit to form a serial shift register during scan testing; and
wherein the clock gating latches comprise respective controllable clock gating latches serially inserted in each line in a manner that permits determination of whether a particular clock delay defect on one of the clock signal lines that causes a scan error during scan testing will also cause a functional error during functional operation.

17. The apparatus of claim 16 wherein the clock gating circuitry further comprises for each of at least a subset of the clock signal lines of the clock distribution network, in addition to a given one of the clock gating latches being coupled in series with the clock signal line of the clock distribution network, logic circuitry having an output coupled to a first control input of the given clock gating latch and operative to control a state of the given clock gating latch at least in part responsive to the scan shift control signal.

18. The apparatus of claim 17 wherein the given clock gating latch further comprises a clock signal input and an output, and wherein the given clock gating latch is controllable between an active state in which a clock signal applied to its clock signal input passes to its output and a freeze state in which the clock signal applied to its clock signal input does not pass to its output but the output is instead maintained at a designated logic level.

19. A processing system comprising:
a processor; and
a memory coupled to the processor and configured to store information characterizing an integrated circuit design;
wherein the processing system is configured to provide scan test circuitry and a clock distribution network within the integrated circuit design, the scan test circuitry comprising at least one scan chain having a plurality of scan cells, the clock distribution network being configured to provide a plurality of clock signals to respective portions of the scan test circuitry;
the clock distribution network comprising:
clock gating circuitry configured to control delivery of one or more of the clock signals along respective clock signal lines of the clock distribution network at least in part responsive to a scan shift control signal and a functional enable signal;
wherein the scan shift control signal also causes the scan cells of the scan chain to form a serial shift register during scan testing; and
wherein the clock gating circuitry is configured to control delivery of the clock signals along the respective clock signal lines of the clock distribution network utilizing controllable clock gating latches serially inserted in each line in a manner that permits determination of whether a particular clock delay defect on one of the clock signal lines that causes a scan error during scan testing will also cause a functional error during functional operation.

* * * * *